United States Patent
Sicard

(10) Patent No.: US 7,982,542 B1
(45) Date of Patent: Jul. 19, 2011

(54) POWER TRANSISTOR FEEDBACK CIRCUIT WITH NOISE AND OFFSET COMPENSATION

(75) Inventor: Thierry Sicard, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/714,112

(22) Filed: Feb. 26, 2010

(51) Int. Cl.
*H03F 1/30* (2006.01)

(52) U.S. Cl. .................. 330/290; 330/257; 330/302

(58) Field of Classification Search .......... 330/290, 330/257, 302
See application file for complete search history.

(56) References Cited

U.S. PATENT DOCUMENTS

| | | | |
|---|---|---|---|
| 5,412,309 A | | 5/1995 | Ueunten |
| 5,416,645 A | | 5/1995 | Fukuyama |
| 5,515,003 A | * | 5/1996 | Kimura .................. 330/253 |
| 6,111,463 A | * | 8/2000 | Kimura .................. 330/254 |
| 6,297,699 B1 | * | 10/2001 | Murray et al. .......... 330/267 |
| 6,639,473 B1 | | 10/2003 | Kobayashi |
| 6,724,260 B2 | * | 4/2004 | Varner et al. .......... 330/288 |
| 6,965,266 B1 | * | 11/2005 | Can ........................ 330/252 |
| 7,602,246 B2 | * | 10/2009 | Zhang et al. ........... 330/253 |
| 7,724,092 B2 | * | 5/2010 | Quan et al. ............. 330/288 |

* cited by examiner

*Primary Examiner* — Patricia Nguyen
(74) *Attorney, Agent, or Firm* — James L. Clingan, Jr.; Daniel D. Hill

(57) ABSTRACT

A circuit comprises a first amplifier portion and a second amplifier portion. The first amplifier portion includes first and second transistors coupled together in a common-base configuration. A current mirror is coupled to the first and second transistors. A first filter is coupled between a first input and the first and second transistors. The second amplifier portion includes third and fourth transistors coupled together in a common-base configuration. First and second current sources are coupled to the third and fourth transistors. A second filter is coupled between a second input and the control electrodes of the third and fourth transistors, wherein the first and second filters are coupled together.

20 Claims, 2 Drawing Sheets

POWER TRANSISTOR FEEDBACK CIRCUIT WITH NOISE AND OFFSET COMPENSATION

BACKGROUND

1. Field

This disclosure relates generally to power transistor feedback circuits and, more specifically, to power transistor feedback circuits that have noise and offset compensation.

2. Related Art

Power transistors typically have driver circuits that use load information for providing the desired control in driving the load. This is particularly common in driver circuits for motor control applications. In motor control applications the environment can have significant noise which can be present on the power supply, which may be a battery. In such environments the noise may be sufficient to adversely impact the performance of the circuits including the motor control circuit itself such as the feedback portion of the circuit that provides information concerning how the load is being driven.

Shown in FIG. 1 is a power circuit 10, according to the prior art, comprising a driver 12, an N channel transistor 14, an N channel transistor 16, an N channel transistor 20, a feedback amplifier 18, and a load 22. The driver 12 provides an activating signal to transistor 16 to cause transistor 16 to provide current to load 22 at an output of the power circuit. The activating signal is also received by transistor 14. Feedback amplifier 18 has a non-inverting input coupled to the output of power circuit 10, an inverting input coupled to a source of transistor 14, and an output coupled to a gate of transistor 20. During proper operation, feedback amplifier 18 senses the voltage on load 22 with the result that the non-inverting input is also at the voltage on load 22. With transistors 14 and 16 having the same drain, gate, and source voltages, the current through transistor 14 is a known ratio of the current through transistor 16 based on the channel widths and lengths of transistor 14 and 16. Thus the current through transistor 20 is a measure of the current through load 22. Thus, the bias conditions for transistor 20 are useful for driver 12 in determining if the current provided to load 22 is providing desired drive. A problem may arise with the operation of amplifier 18 when the power supply has large amounts of noise. These large amounts are sufficiently common that there is a standard test called direct power injection (DPI) that is used to determine if power circuit 10 can properly function under the high noise conditions. In this test, feedback amplifier 18 may not be able to provide proper function unless the circuit is designed to include noise compensation. This drawing is somewhat simplified for clarity. For example, there is commonly transistors that are added to ensure that if the battery is reversed these transistors become non-conductive and prevent damage to the circuitry that may otherwise occur if the battery terminals were reversed.

Shown in FIG. 2 is feedback amplifier 18, according to the prior art, in more detail and having noise compensation. The inverting input is shown as (−), the non-inverting input is shown as (+), and the output is connected to the gate of transistor 20 and driver 12. A standard amplifier is made up of PNP transistors 30 and 42, P channel transistors 32 and 38, and current sources 34 and 48. Transistors 30 42 function as one current mirror and transistors 32 and 38 function as another current mirror. Capacitor 36 is a parasitic capacitance that contributes to problems caused by the high noise conditions Transistor 50 and current source 52 are common for providing the actual output. NPN transistors 28 and 44, resistors 26 and 46, and capacitor 47 are useful in providing noise compensation which keeps feedback amplifier 18 functioning properly in high noise conditions. A disadvantage though is that there is an increase in the offset error, which is the difference voltage for the inverting and non-inverting voltages during the operation of the kind shown in FIG. 1. This results in the bias conditions on transistors 14 and 16 being different so that the current ratio is not as precisely known as without the noise compensation. The effect is that information received by the driver is less accurate resulting in the current through the load is less precisely controlled.

Accordingly there is a need for a feedback amplifier that improves upon the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A power driver has a feedback amplifier that has both noise and offset compensation. The noise compensation is placed in a manner that allows the desired differential amplification that avoids the offset problems associated with cascading NPN and PNP transistors in a differential amplifier. This is better understood by reference to the drawings and the following description.

Figure 1:
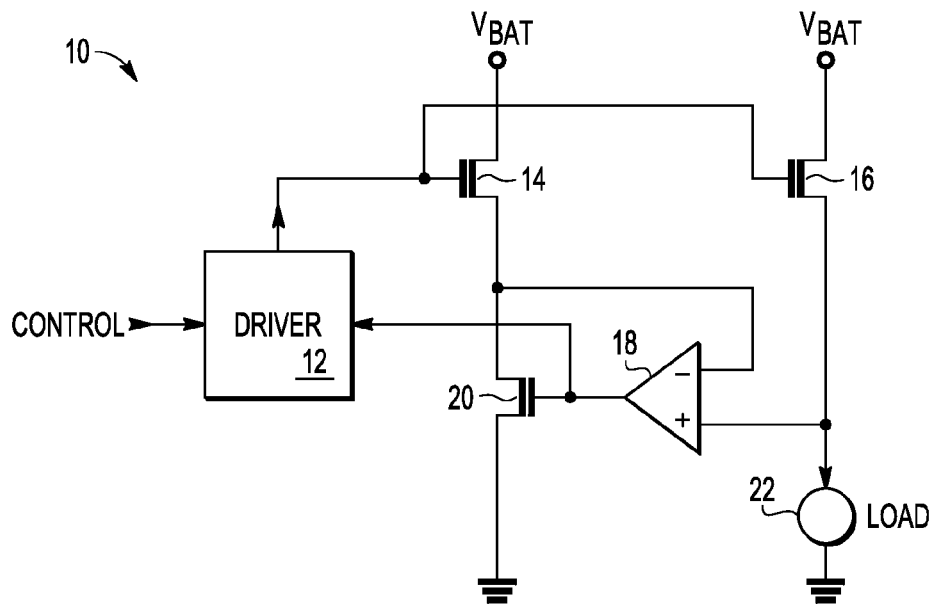
FIG. 1 is a combination circuit diagram and block diagram of a power driver according to the prior art.
Figure 3:
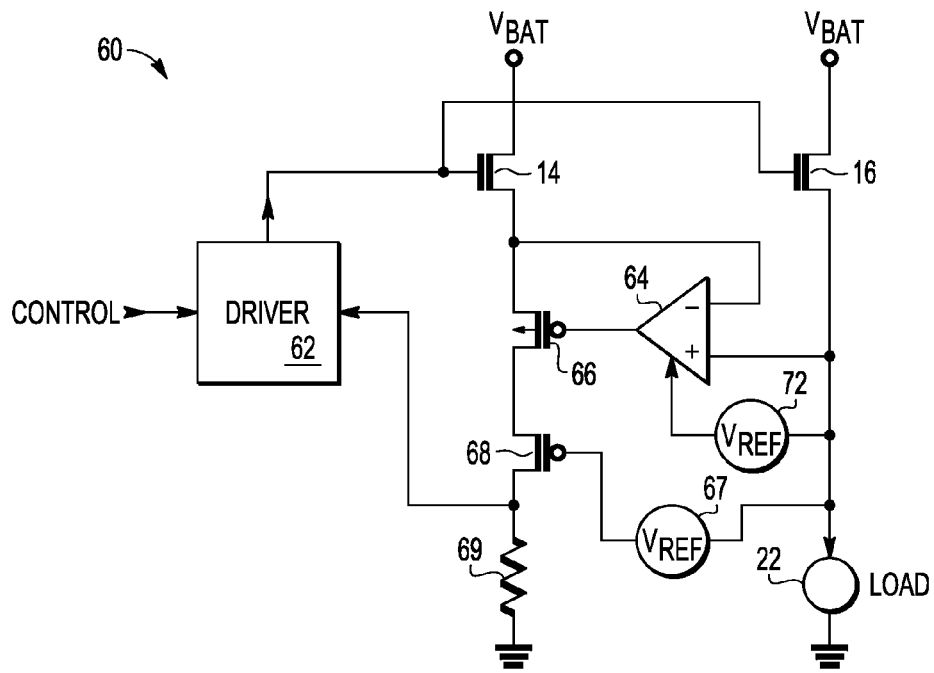
FIG. 3 is a combination circuit diagram and block diagram of a power driver according to an embodiment.

Shown in FIG. 3 is a power circuit 60 comprising a driver 62, a feedback amplifier 64, a P channel transistor 66, a P channel transistor 68, a resistance 69, a reference voltage circuit 67, and a reference voltage 72. Transistor 14 has a drain connected to a positive power supply terminal Vbat, a gate connected to an output of driver 62, and a source. Transistor 16 has a drain connected to Vbat, a gate connected to the output of driver 62, and a source that functions as the output of power circuit 60. Load 22 has a first terminal connected to the source of transistor 16 and a second terminal connected to a negative power supply terminal which in this case is ground. Negative power supply terminal in this context means a power supply terminal that is intended to be at a lower potential than the positive power supply terminal. Transistors 14 and 16 and load 22 may the same as those shown in FIG. 1. Driver 62 has a first input for receiving a control signal that indicates when transistor 16 is to provide current to load 22. Driver 62 also has a second input for receiving information as to the current flowing through load 22. Amplifier 64 has a non-inverting input coupled to the source of transistor 16, an inverting input coupled to the source of transistor 14, and an output connected to a gate of transistor 66. Transistor 66 has a source connected to the source of transistor 14 and a drain connected to a source of transistor 68. Transistor 68 has a drain connected to the second input of driver 62 and a gate. Resistance 69 has a first terminal connected to the drain of transistor 68 and a second terminal connected to ground. Reference voltage circuit 67 has a first terminal connected to the source of transistor 16 and a second terminal connected to the gate of transistor 68. Reference voltage circuit 72 has a first terminal connected to the source of transistor 16 and a second terminal connected to the non-inverting input of feedback amplifier 64. Reference voltage circuits drop a predetermined voltage, for example 5 volts, from the source of transistor 16 from the first terminal to the second terminal. The body of transistor 68 is tied to its source. The body of transistor 66 is tied to the source of transistor 16. Transistors 70 and 71 together may be considered a current mirror. Similarly, transistors 88 and 90 together may be considered a current mirror.

Figure 2:
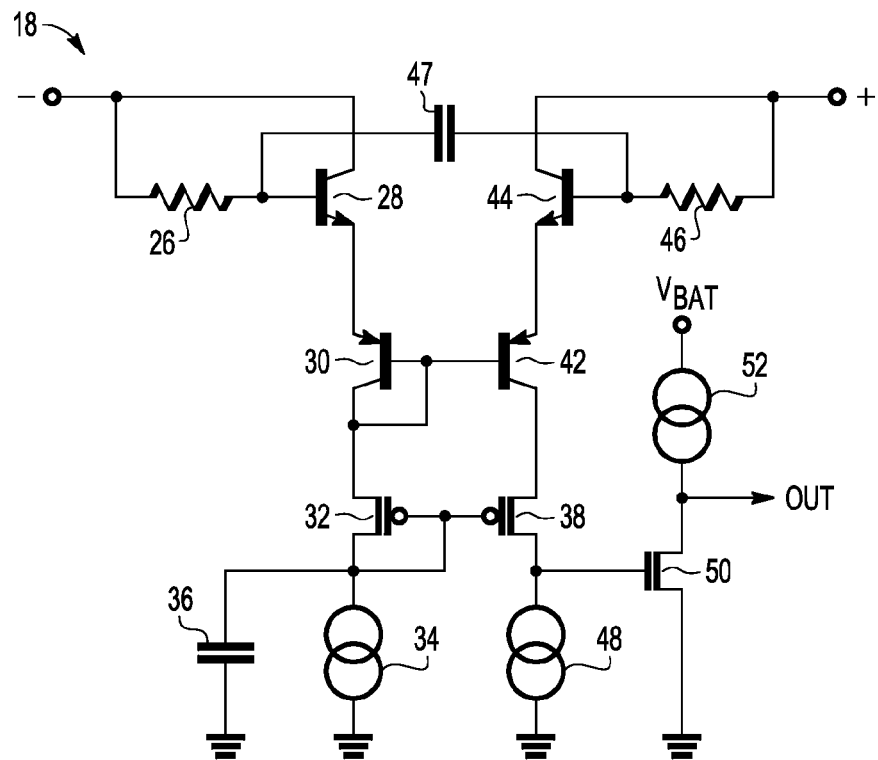
FIG. 2 is a circuit diagram of a feedback amplifier of the power driver of FIG. 1.

In operation, feedback amplifier 64 is powered by the voltage at the source of transistor 16 and the second terminal of reference voltage circuit 72. The positive power supply for feedback amplifier 64 is the voltage at the source of transistor and negative power supply is the voltage at the second terminal of reference voltage circuit 72. This provides some noise compensation by powering feedback amplifier that has some isolation from the noise on Vbat. Feedback amplifier 64 includes additional noise compensation while avoiding the offset issue arising from the configuration of FIG. 2. Feedback amplifier 64 functions as a differential amplifier so that the output of feedback amplifier 64 causes transistor 66 to be conductive so as the voltage at the inverting input is substantially the same, with very little offset, as the voltage on the non-inverting input. Thus with the bias conditions the same for transistors 14 and 16 there currents are a known ratio based on their comparative channel lengths and widths. Transistor 66 is biased at its gate by reference voltage circuit 67 at the same voltage as the negative power supply of feedback amplifier 64 as supplied by reference voltage circuit 72. The known current through transistor 14, which passes through transistor 66 and thus transistor 68, is converted to a voltage by passing through resistance 69. In this way driver 62 has accurate information as to the current passing through transistor 16 and thus load 22.

Figure 4:
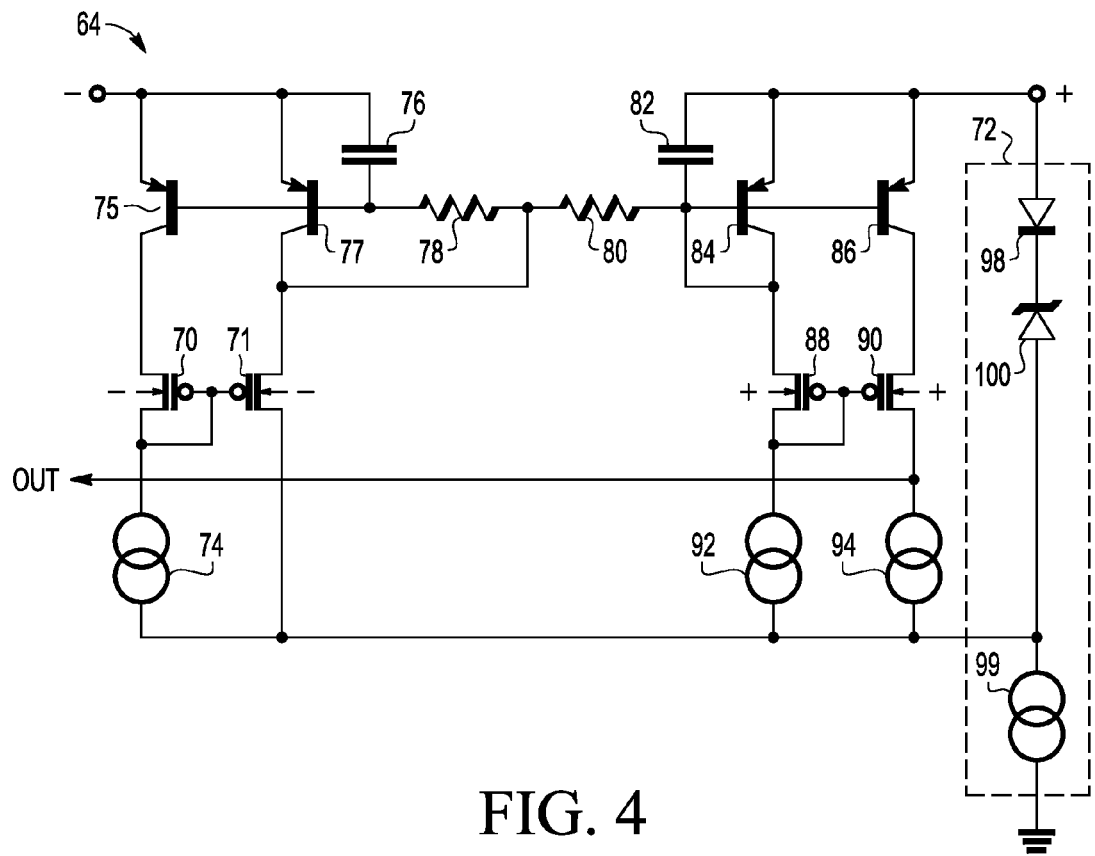
FIG. 4 is a circuit diagram of a feedback amplifier and reference voltage of the power driver of FIG. 3.

Shown in FIG. 4 is feedback amplifier 64 and reference circuit 72. Feedback amplifier 64 comprises an PNP transistor 75, a PNP transistor 77, a resistor 78, a capacitor 76, a P channel transistor 70, a P channel transistor 71, a current source 74, a resistor 80, a capacitor 82, a PNP transistor 84, a PNP transistor 86, a P channel transistor 88, a P channel transistor 90, a current source 92, and a current source 94. Voltage reference circuit 72 comprises a diode 98, a zener diode 100, a current source 99. Diode 98 has an anode connected to the source of transistor 16 which is at the non-inverting input (+) of feedback amplifier 64. Zener diode 100 has a cathode connected to a cathode of diode 98. Current source has a first terminal connected to an anode of zener diode 100 and a second terminal connected to ground. The output of the voltage reference circuit 72 is at the connection between the first terminal of current source 99 and the anode of zener diode 100. The current through voltage reference circuits 70 and 72 and amplifier 64 is in the order of microamps whereas the current through transistor 16 is the order of tens of amps. Thus the current drained away from load 22 by reference circuits 70 and 72 feedback amplifier 64 is negligible.

Transistor 75 has an emitter connected to the inverting input (−), a base, and a collector. Transistor has an emitter connected to the inverting input (−), a base connected to the base of transistor 75, and a collector. Capacitor 76 has a first terminal connected to the inverting input (−) and a second terminal connected to the base of transistor 77. Resistor 78 has a first terminal connected to the first terminal of capacitor 76 and a second terminal connected to the collector of transistor 77. Resistor 80 has a first terminal connected to the second terminal of resistor 78 and a second terminal. Capacitor 82 has a first terminal connected to the second terminal of resistor 80 and a second terminal connected to the non-inverting input (+). Transistor 84 has an emitter connected to the non-inverting input (+), a base connected to the second terminal of resistor 80, and a collector connected to the base of transistor 84. Transistor 86 has an emitter connected to the non-inverting input (+), a base connected to the base of transistor 84, and a collector. Transistor 70 has a source connected to the collector of transistor 75 and a drain and a gate connected together. Transistor 71 has a source connected to the collector of transistor 77, a gate connected to the gate of transistor 70, and a drain connected to the output of reference circuit 72. Current source 74 has a first terminal connected to the drain of transistor 70 and a second terminal connected to the output of voltage reference 72. Transistor 88 has a source connected to the collector of transistor 84 and a gate and a drain connected together. Current source 92 has a first terminal connected to the drain of transistor 88 and a second terminal connected to the output of voltage reference 72. Transistor 90 has a source connected to the collector of transistor 86, a gate connected to the gate of transistor 88, and a drain which provides the output OUT of feedback amplifier 64. Current source 94 has a first terminal connected to the drain of transistor 90 and a second terminal connected to the output of voltage reference 72. The bodies of transistors 70 and 71 are tied to the inverting input. The bodies of transistors 88 and 90 are tied to non-inverting input.

As described previously, feedback amplifier 64 is powered by the voltage differential between the two terminal of voltage reference 72. Thus changes in the voltage at the non-inverting input are automatically also made at the output of voltage reference 72. This has the effect of reducing noise in feedback amplifier 64. Corresponding elements are matched so that transistors 75, 77, 84, and 88 are the same; resistors 78 and 80 are the same; capacitors 76 and 82 are the same; and transistors 70, 71, 88, and 90 are the same. Resistor 78 and capacitor 76 function as a low pass filter in which the high frequency attenuation is based on the RC time constant. In this example, the resistance may be about 10K ohms and the capacitance may be about 5 picofarads which is also the case for resistor 80 and capacitor 82. These values need to be adjusted based on factors such as the particular transistor characteristics, the anticipated frequencies of the noise, the amount of noise that can be tolerated, the required response time of amplifier 64, and potentially other factors.

Feedback amplifier 64 can be viewed as having a first portion on the left side having transistors 75, 77, 70, and 71; capacitor 76; resistor 78; and current source 74 and a right side comprising transistors 84, 86, 88, and 90; capacitor 82; resistor 80; and current sources 92 and 94. Any differential between the inverting and non-inverting inputs will be greatly amplified at the drain of transistor 90 due to the current mirror arrangements of bipolar transistors 75, 77, 84, and 86 and P channel transistors 70, 71, 88, and 90. Because the intent of using amplifier 64 is for establishing identical bias conditions on transistors 14 and 16, linearity is not nearly as important as high gain and low offset. Thus, feedback amplifier 64 is effective at providing good compensation for offset and high noise while providing the desired high gain. Amplifier 64 is used in a high side driver in which the positive side of the battery is selectively applied to the load. Thus transistor 16 may be considered a high side transistor.

Similar to the prior art, it may desirable to have some additional circuitry to avoid damaging the circuit in the case the battery is reversed which in this case would be when Vbat is reversed. Also similar to the prior art, this can be achieved by adding coupling transistors that reverse their function to blocking transistors for the case where Vbat is reversed in voltage to avoid. In the case where such a preventative action is desired, a coupling/blocking transistor should be between each of the source of transistor 14 and the source of transistor 66, the inverting input and the source of transistor 14, the non-inverting input and the source of transistor 16, and the body of transistor 66 and the source of transistor 16.

Thus it is seen that a power circuit has a feedback amplifier that has compensation for both offset and high noise while providing high gain.

By now it should be appreciated that there has been provided a circuit including a first amplifier portion and a second amplifier portion. The first amplifier portion includes a first transistor having a first current electrode coupled to a first input, a second current electrode, and a control electrode. The first amplifier portion further includes a second transistor having a first current electrode coupled to the first input, a second current electrode, and a control electrode coupled to the control electrode of the first transistor. The first amplifier portion further includes a current mirror coupled to the second current electrodes of the first and second transistors. The first amplifier portion further includes a first filter coupled between the first input and the control electrodes of the first and second transistors. The second amplifier portion includes a third transistor having a first current electrode coupled to a second input, a second current electrode, and a control electrode coupled to the second current electrode of the third transistor. The second amplifier portion further includes a fourth transistor having a first current electrode coupled to the second input, a second current electrode coupled to an output terminal, and a control electrode coupled to the control electrode of the third transistor. The second amplifier portion further includes a first current source having a first terminal coupled to the third transistor, and a second terminal. The second amplifier portion further includes a second current source having a first terminal coupled to the fourth transistor, and a second terminal. The second amplifier portion further includes a second filter coupled between the second input and the control electrodes of the third and fourth transistors, and wherein the first and second filters are coupled together. The circuit may have a further characterization by which the first filter comprises a first capacitor having a first plate electrode coupled to the first input, and a second plate electrode coupled to the control electrodes of the first and second transistors and a first resistive element having a first terminal coupled to the control electrodes of the first and second transistors, and a second terminal coupled to the second current electrode of the second transistor. The circuit may have a further characterization by which the second filter comprises a second capacitor having a first plate electrode coupled to the second input, and a second plate electrode coupled to the control electrodes of the third and fourth transistors and a second resistive element having a first terminal coupled to the control electrodes of the third and fourth transistors, and a second terminal coupled to the second terminal of the first resistive element. The circuit may have a further characterization by which the current mirror comprises a fifth transistor having a first current electrode coupled to the second current electrode of the first transistor, a second current electrode, and a control electrode coupled to the second current electrode of the fifth transistor and a sixth transistor having a first current electrode coupled to the second current electrode of the second transistor, a second current electrode, and a control electrode coupled to the control electrode of the fifth transistor. The circuit may have a further characterization by which the fifth and sixth transistors each further comprises a body terminal coupled to the first input. The circuit may further comprise a voltage reference source coupled between the second input and the second terminals of the first and second current sources. The circuit may have a further characterization by which the voltage reference source comprises a diode having a first terminal coupled to the second input, and a second terminal and a zener diode having a first terminal coupled to the second terminal of the diode, and a second terminal coupled to the second terminals of the first and second current sources. The circuit may further comprise a seventh transistor having a first current electrode coupled to a first power supply voltage terminal, a second current electrode coupled to the first input, and a control electrode; an eighth transistor having a first current electrode coupled to the second current electrode of the seventh transistor, a second current electrode, and a control electrode coupled to the output terminal; a third resistive element having a first terminal coupled to the second current electrode of the eighth transistor, and a second terminal coupled to a second power supply voltage terminal; and a high side switch transistor having a first current electrode coupled to the first power supply voltage terminal, a second current electrode coupled to the second input, and a control electrode. The circuit may have a further characterization by which the seventh transistor is an N-channel transistor and the eighth transistor is a P-channel transistor.

Described also is a circuit comprising a first amplifier portion, a second amplifier portion, and a third current source. The first amplifier portion includes a first transistor having a first current electrode coupled to a first input, a second current electrode, and a control electrode; a second transistor having a first current electrode coupled to the first input, a second current electrode, and a control electrode coupled to the control electrode of the first transistor; a current mirror coupled to the second current electrodes of the first and second transistors; and a first filter coupled between the first input and the control electrodes of the first and second transistors. The second amplifier portion comprises a third transistor having a first current electrode coupled to a second input, a second current electrode, and a control electrode coupled to the second current electrode of the third transistor; a fourth transistor having a first current electrode coupled to the second input, a second current electrode coupled to an output terminal, and a control electrode coupled to the control electrode of the third transistor; a first current source having a first terminal coupled to the third transistor, and a second terminal; a second current source having a first terminal coupled to the fourth transistor, and a second terminal; and a second filter coupled between the second input and the control electrodes of the third and fourth transistors, and wherein the first and second filters are coupled together. The third current source has a first terminal coupled to the second terminals of both the first and second current sources, and a second terminal coupled to a first power supply voltage terminal. The circuit may have a further characterization by which the first filter comprises a first capacitor having a first plate electrode coupled to the first input, and a second plate electrode coupled to the control electrodes of the first and second transistors; and a first resistive element having a first terminal coupled to the control electrodes of the first and second transistors, and a second terminal coupled to the second current electrode of the second transistor. The circuit may have a further characterization by which the second filter comprises a second capacitor having a first plate electrode coupled to the second input, and a second plate electrode coupled to the control electrodes of the third and fourth transistors; and a second resistive element having a first terminal coupled to the control electrodes of the third and fourth transistors, and a second terminal coupled to the second terminal of the first resistive element. The circuit may have a further characterization by which the current mirror comprises a fifth transistor having a first current electrode coupled to the second current electrode of the first transistor, a second current electrode, and a control electrode coupled to the second current electrode of the fifth transistor; and a sixth transistor having a first current electrode coupled to the second current electrode of the second transistor, a second current electrode, and a control electrode coupled to the control electrode of the fifth transistor. The circuit may have a further characterization by which the fifth and sixth transistors each further comprises a body terminal coupled to the first input. The circuit may further comprise a voltage reference source coupled between the second input and the second terminals of the first and second current sources. The circuit may have a further characterization by which the voltage reference source comprises a diode having a first terminal coupled to the second input, and a second terminal; and a zener diode having a first terminal coupled to the second terminal of the diode, and a second terminal coupled to the second terminals of the first and second current sources. The circuit may further comprise a seventh transistor having a first current electrode coupled to a first power supply voltage terminal, a second current electrode coupled to the first input, and a control electrode; an eighth transistor having a first current electrode coupled to the second current electrode of the seventh transistor, a second current electrode, and a control electrode coupled to the output terminal; a third resistive element having a first terminal coupled to the second current electrode of the eighth transistor, and a second terminal coupled to a second power supply voltage terminal; and a high side switch transistor having a first current electrode coupled to the first power supply voltage terminal, a second current electrode coupled to the second input, and a control electrode.

Also described is a circuit having a first amplifier portion and a second amplifier portion. The first amplifier portion includes a first transistor having a first current electrode coupled to a first input, a second current electrode, and a control electrode; a second transistor having a first current electrode coupled to the first input, a second current electrode, and a control electrode coupled to the control electrode of the first transistor; a current mirror coupled to the second current electrodes of the first and second transistors; a first capacitor having a first plate electrode coupled to the first input, and a second plate electrode coupled to the control electrodes of the first and second transistors; and a first resistive element having a first terminal coupled to the control electrodes of the first and second transistors, and a second terminal coupled to the second current electrode of the second transistor. The second amplifier portion includes a third transistor having a first current electrode coupled to a second input, a second current electrode, and a control electrode coupled to the second current electrode of the third transistor; a fourth transistor having a first current electrode coupled to the second input, a second current electrode coupled to an output terminal, and a control electrode coupled to the control electrode of the third transistor; a first current source having a first terminal coupled to the third transistor, and a second terminal; a second current source having a first terminal coupled to the fourth transistor, and a second terminal; a second capacitor having a first plate electrode coupled to the second input, and a second plate electrode coupled to the control electrodes of the third and fourth transistors; and a second resistive element having a first terminal coupled to the control electrodes of the third and fourth transistors, and a second terminal coupled to the second terminal of the first resistive element. The circuit may further comprise a voltage reference source coupled between the second input and the second terminals of the first and second current sources; and a third current source having a first terminal coupled to the second terminals of both the first and second current sources, and a second terminal coupled to a power supply voltage terminal. The circuit may have a further characterization by which the current mirror includes a fifth transistor having a first current electrode coupled to the second current electrode of the first transistor, a second current electrode, a control electrode coupled to the second current electrode of the fifth transistor, and a body terminal coupled to the first input; and a sixth transistor having a first current electrode coupled to the second current electrode of the second transistor, a second current electrode, a control electrode coupled to the control electrode of the fifth transistor, and a body terminal coupled to the first input.

Although the invention is described herein with reference to specific embodiments, various modifications and changes can be made without departing from the scope of the present invention as set forth in the claims below. For example, some transistor types may be reversed with corresponding voltage polarity changes. The described example is for a high side driver, but there may be benefit in using a similar approach to that described for FIGS. 3 and 4 for a low side driver. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A circuit comprising:
   a first amplifier portion comprising:
     a first transistor having a first current electrode coupled to a first input, a second current electrode, and a control electrode;
     a second transistor having a first current electrode coupled to the first input, a second current electrode, and a control electrode coupled to the control electrode of the first transistor;
     a current mirror coupled to the second current electrodes of the first and second transistors; and
     a first filter coupled between the first input and the control electrodes of the first and second transistors; and
   a second amplifier portion comprising:
     a third transistor having a first current electrode coupled to a second input, a second current electrode, and a control electrode coupled to the second current electrode of the third transistor;
     a fourth transistor having a first current electrode coupled to the second input, a second current elec- trode coupled to an output terminal, and a control electrode coupled to the control electrode of the third transistor;
a first current source having a first terminal coupled to the third transistor, and a second terminal;
a second current source having a first terminal coupled to the fourth transistor, and a second terminal; and
a second filter coupled between the second input and the control electrodes of the third and fourth transistors, and wherein the first and second filters are coupled together.

2. The circuit of claim 1, wherein the first filter comprises:
a first capacitor having a first plate electrode coupled to the first input, and a second plate electrode coupled to the control electrodes of the first and second transistors; and
a first resistive element having a first terminal coupled to the control electrodes of the first and second transistors, and a second terminal coupled to the second current electrode of the second transistor.

3. The circuit of claim 2, wherein the second filter comprises:
a second capacitor having a first plate electrode coupled to the second input, and a second plate electrode coupled to the control electrodes of the third and fourth transistors; and
a second resistive element having a first terminal coupled to the control electrodes of the third and fourth transistors, and a second terminal coupled to the second terminal of the first resistive element.

4. The circuit of claim 1, wherein the current mirror comprises:
a fifth transistor having a first current electrode coupled to the second current electrode of the first transistor, a second current electrode, and a control electrode coupled to the second current electrode of the fifth transistor; and
a sixth transistor having a first current electrode coupled to the second current electrode of the second transistor, a second current electrode, and a control electrode coupled to the control electrode of the fifth transistor.

5. The circuit of claim 4, wherein the fifth and sixth transistors each further comprises a body terminal coupled to the first input.

6. The circuit of claim 1, further comprising a voltage reference source coupled between the second input and the second terminals of the first and second current sources.

7. The circuit of claim 6, wherein the voltage reference source comprises:
a diode having a first terminal coupled to the second input, and a second terminal; and
a zener diode having a first terminal coupled to the second terminal of the diode, and a second terminal coupled to the second terminals of the first and second current sources.

8. The circuit of claim 1, further comprising:
a seventh transistor having a first current electrode coupled to a first power supply voltage terminal, a second current electrode coupled to the first input, and a control electrode;
an eighth transistor having a first current electrode coupled to the second current electrode of the seventh transistor, a second current electrode, and a control electrode coupled to the output terminal;
a third resistive element having a first terminal coupled to the second current electrode of the eighth transistor, and a second terminal coupled to a second power supply voltage terminal; and
a high side switch transistor having a first current electrode coupled to the first power supply voltage terminal, a second current electrode coupled to the second input, and a control electrode.

9. The circuit of claim 8, wherein the seventh transistor is an N-channel transistor and the eighth transistor is a P-channel transistor.

10. A circuit comprising:
a first amplifier portion comprising:
a first transistor having a first current electrode coupled to a first input, a second current electrode, and a control electrode;
a second transistor having a first current electrode coupled to the first input, a second current electrode, and a control electrode coupled to the control electrode of the first transistor;
a current mirror coupled to the second current electrodes of the first and second transistors; and
a first filter coupled between the first input and the control electrodes of the first and second transistors;
a second amplifier portion comprising:
a third transistor having a first current electrode coupled to a second input, a second current electrode, and a control electrode coupled to the second current electrode of the third transistor;
a fourth transistor having a first current electrode coupled to the second input, a second current electrode coupled to an output terminal, and a control electrode coupled to the control electrode of the third transistor;
a first current source having a first terminal coupled to the third transistor, and a second terminal;
a second current source having a first terminal coupled to the fourth transistor, and a second terminal; and
a second filter coupled between the second input and the control electrodes of the third and fourth transistors, and wherein the first and second filters are coupled together; and
a third current source having a first terminal coupled to the second terminals of both the first and second current sources, and a second terminal coupled to a first power supply voltage terminal.

11. The circuit of claim 10, wherein the first filter comprises:
a first capacitor having a first plate electrode coupled to the first input, and a second plate electrode coupled to the control electrodes of the first and second transistors; and
a first resistive element having a first terminal coupled to the control electrodes of the first and second transistors, and a second terminal coupled to the second current electrode of the second transistor.

12. The circuit of claim 11, wherein the second filter comprises:
a second capacitor having a first plate electrode coupled to the second input, and a second plate electrode coupled to the control electrodes of the third and fourth transistors; and
a second resistive element having a first terminal coupled to the control electrodes of the third and fourth transistors, and a second terminal coupled to the second terminal of the first resistive element.

13. The circuit of claim 10, wherein the current mirror comprises:
a fifth transistor having a first current electrode coupled to the second current electrode of the first transistor, a second current electrode, and a control electrode coupled to the second current electrode of the fifth transistor; and a sixth transistor having a first current electrode coupled to the second current electrode of the second transistor, a second current electrode, and a control electrode coupled to the control electrode of the fifth transistor.

14. The circuit of claim 13, wherein the fifth and sixth transistors each further comprises a body terminal coupled to the first input.

15. The circuit of claim 10, further comprising a voltage reference source coupled between the second input and the second terminals of the first and second current sources.

16. The circuit of claim 15, wherein the voltage reference source comprises:
   a diode having a first terminal coupled to the second input, and a second terminal; and
   a zener diode having a first terminal coupled to the second terminal of the diode, and a second terminal coupled to the second terminals of the first and second current sources.

17. The circuit of claim 10, further comprising:
   a seventh transistor having a first current electrode coupled to a first power supply voltage terminal, a second current electrode coupled to the first input, and a control electrode;
   an eighth transistor having a first current electrode coupled to the second current electrode of the seventh transistor, a second current electrode, and a control electrode coupled to the output terminal;
   a third resistive element having a first terminal coupled to the second current electrode of the eighth transistor, and a second terminal coupled to a second power supply voltage terminal; and
   a high side switch transistor having a first current electrode coupled to the first power supply voltage terminal, a second current electrode coupled to the second input, and a control electrode.

18. A circuit comprising:
   a first amplifier portion comprising:
      a first transistor having a first current electrode coupled to a first input, a second current electrode, and a control electrode;
      a second transistor having a first current electrode coupled to the first input, a second current electrode, and a control electrode coupled to the control electrode of the first transistor;
      a current mirror coupled to the second current electrodes of the first and second transistors;
      a first capacitor having a first plate electrode coupled to the first input, and a second plate electrode coupled to the control electrodes of the first and second transistors; and
      a first resistive element having a first terminal coupled to the control electrodes of the first and second transistors, and a second terminal coupled to the second current electrode of the second transistor; and
   a second amplifier portion comprising:
      a third transistor having a first current electrode coupled to a second input, a second current electrode, and a control electrode coupled to the second current electrode of the third transistor;
      a fourth transistor having a first current electrode coupled to the second input, a second current electrode coupled to an output terminal, and a control electrode coupled to the control electrode of the third transistor;
      a first current source having a first terminal coupled to the third transistor, and a second terminal;
      a second current source having a first terminal coupled to the fourth transistor, and a second terminal;
      a second capacitor having a first plate electrode coupled to the second input, and a second plate electrode coupled to the control electrodes of the third and fourth transistors; and
      a second resistive element having a first terminal coupled to the control electrodes of the third and fourth transistors, and a second terminal coupled to the second terminal of the first resistive element.

19. The circuit of claim 18, further comprising:
   a voltage reference source coupled between the second input and the second terminals of the first and second current sources; and
   a third current source having a first terminal coupled to the second terminals of both the first and second current sources, and a second terminal coupled to a power supply voltage terminal.

20. The circuit of claim 18, wherein the current mirror comprises:
   a fifth transistor having a first current electrode coupled to the second current electrode of the first transistor, a second current electrode, a control electrode coupled to the second current electrode of the fifth transistor, and a body terminal coupled to the first input; and
   a sixth transistor having a first current electrode coupled to the second current electrode of the second transistor, a second current electrode, a control electrode coupled to the control electrode of the fifth transistor, and a body terminal coupled to the first input.

* * * * *